United States Patent
Oohashi

(10) Patent No.: US 7,213,741 B2
(45) Date of Patent: May 8, 2007

(54) LEAD WIRE BONDING METHOD

(75) Inventor: Atsushi Oohashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 153 days.

(21) Appl. No.: 10/963,504

(22) Filed: Oct. 14, 2004

(65) Prior Publication Data

US 2005/0252948 A1 Nov. 17, 2005

(30) Foreign Application Priority Data

May 17, 2004 (JP) ............................. 2004-145871

(51) Int. Cl.
*B23K 31/02* (2006.01)

(52) U.S. Cl. .................. 228/180.5; 228/110.1

(58) Field of Classification Search ............. 228/180.5, 228/4.5, 110.1; 310/71
See application file for complete search history.

(56) References Cited

U.S. PATENT DOCUMENTS 5,101,322 A * 3/1992 Ghaem et al. .............. 361/715
5,572,065 A * 11/1996 Burns .......................... 257/666
6,172,434 B1 * 1/2001 Oohashi et al. ................ 310/71
6,336,269 B1 * 1/2002 Eldridge et al. .............. 29/885
2003/0070482 A1 * 4/2003 Straight et al. ........... 73/204.12

FOREIGN PATENT DOCUMENTS

JP 56-148852 * 11/1981
JP 2768141 B2 4/1998

* cited by examiner

*Primary Examiner*—Jonathan Johnson
(74) *Attorney, Agent, or Firm*—Sughrue Mion, PLLC

(57) ABSTRACT

After respective one ends of lead wires are fixed to a printed circuit board, the lead wires are bent, the printed circuit board is brought into a case and the other ends of the lead wires are bonded to terminals of the case. Since the lead wires are processed before the substrate is brought into the case, this eliminates the necessity to perform formation of the bent portions of the lead wires and fixing of the lead wires to the substrate in a narrow space of the case and allows simplification of bonding operation. Thus provided is a lead wire bonding method for bonding lead wires with bent portions to the substrate, which simplifies a bonding operation.

4 Claims, 11 Drawing Sheets

F I G. 1 5
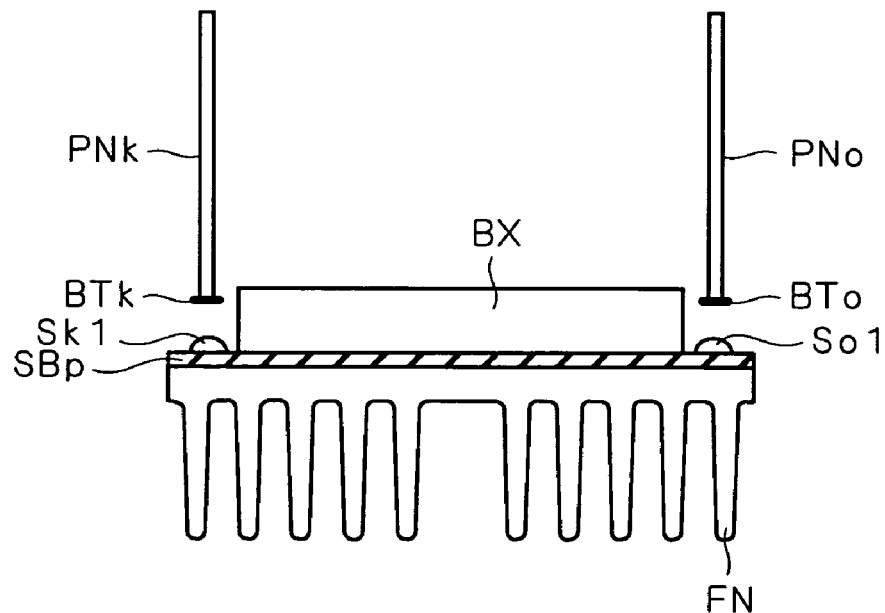
F I G. 1 6
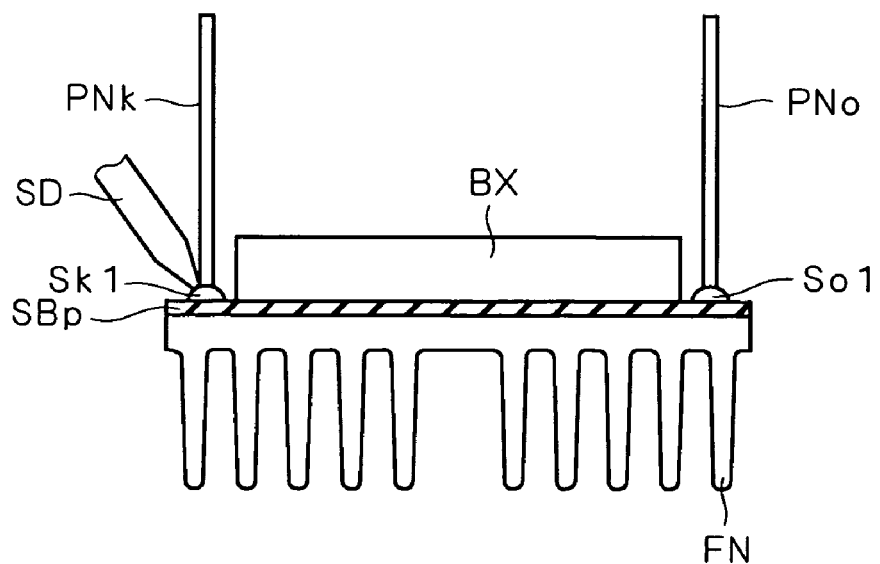

LEAD WIRE BONDING METHOD

BACKGROUND OF THE INVENTION

1. Field of the Invention

The present invention relates to a lead wire bonding method for bonding a lead wire having a bent portion to a printed circuit board.

2. Description of the Background Art

As the lead wire bonding method for bonding a lead wire having a bent portion to a printed circuit board, there are various techniques. For example, the Patent Document 1 (Japanese Patent No. 2768141) shows a technique using laser beam welding.

If a lead wire has a bent portion, even in circumstances with heavy vibration, the bent portion of the lead wire absorbs the vibration to decrease bonding failure of the lead wire.

In the above Patent Document 1, as shown in FIG. 9, disclosed is a technique in which a pad 3 on a substrate 6 and a terminal 2 provided in a case 4 are connected to each other with a lead wire 5.

In the lead wire bonding method of the above Patent Document 1, however, formation of a bent portion of the lead wire and welding of the lead wire to the substrate must be performed in a narrow space of the case 4 and this requires complicated operations of a molding pin 86 and a welding nozzle 41. Therefore, the lead wire bonding operation becomes complicated and this increases time for manufacture and decreases yield due to bonding failure.

SUMMARY OF THE INVENTION

It is an object of the present invention to provide a lead wire bonding method for bonding a lead wire having a bent portion to a substrate, which simplifies a bonding operation.

According to an aspect of the present invention, a lead wire bonding method includes the following steps (a) to (c). The step (a) is to fix one end of a lead wire having the one end and an other end to a substrate. The step (b) is to bend the lead wire after being fixed. The step (c) is to bring the substrate to which the bent lead wire is fixed into a case having a terminal and to bond the other end of the lead wire to the terminal of the case.

In the present invention, the lead wire is bent after one end of the lead wire is fixed to the substrate, the substrate is brought into the case and the other end of the lead wire is bonded to the terminal of the case. Therefore, since the lead wire is processed (bent and fixed to the substrate) before the substrate is brought into the case, this eliminates the necessity to perform formation of the bent portion of the lead wire and fixing of the lead wire to the substrate in a narrow space of the case and allows simplification of bonding operation.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 14 to 19 are cross sections showing process steps of the lead wire bonding method in accordance with the second preferred embodiment.

DESCRIPTION OF THE PREFERRED EMBODIMENTS

<The First Preferred Embodiment>

The first preferred embodiment relates to a lead wire bonding method in which a lead wire is bent after one end of the lead wire is fixed to a substrate and the substrate is brought into a case to bond the other end of the lead wire to a terminal of the case.

Since the lead wire is processed (bent and fixed to the substrate) before the substrate is brought into the case, this eliminates the necessity to perform formation of the bent portion of the lead wire and fixing of the lead wire to the substrate in a narrow space of the case and allows simplification of bonding operation.

Figure 1:
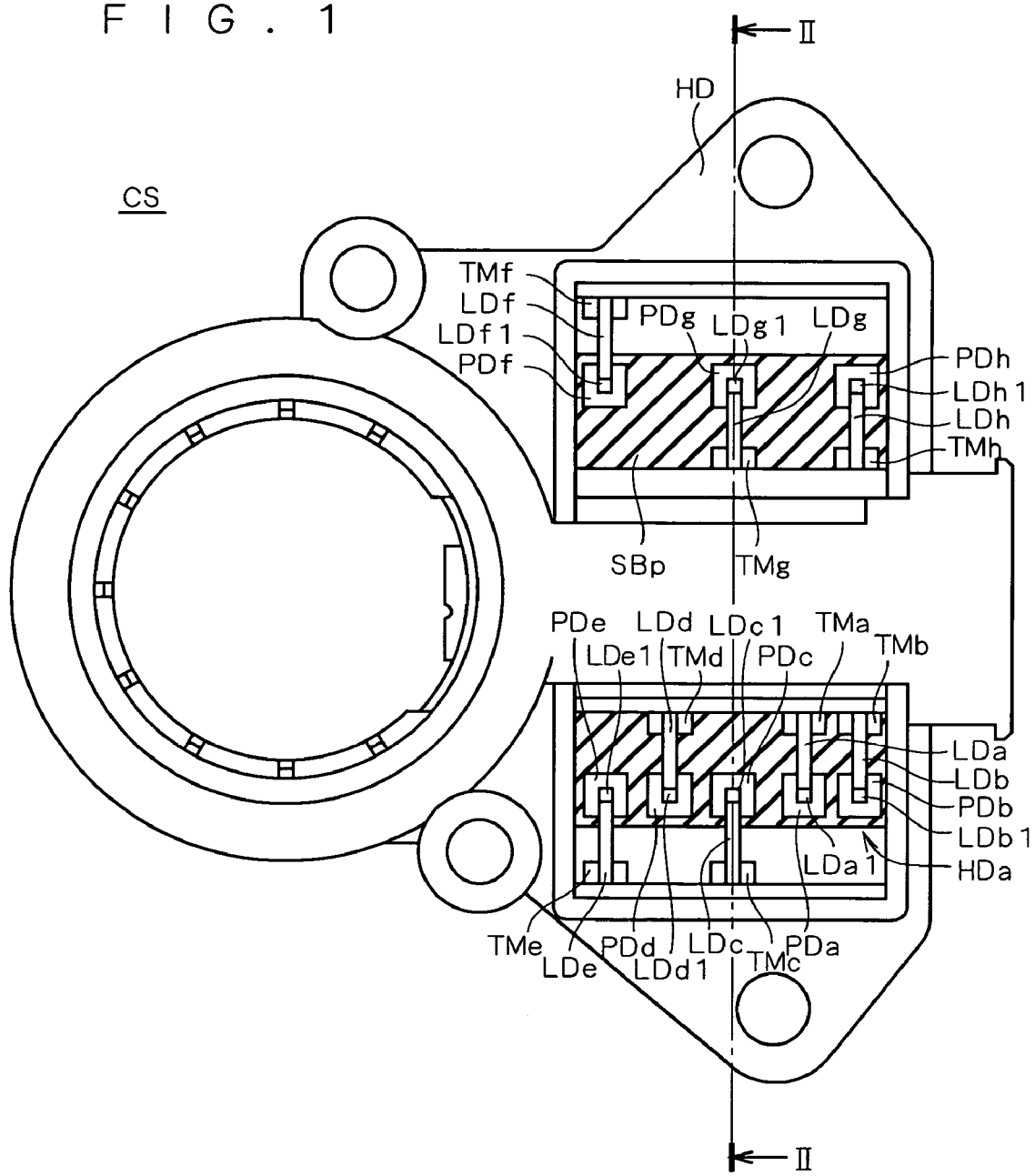
FIG. 1 is a plan view showing a structure of a vehicle alternator component to which a lead wire bonding method using soldering in accordance with a first preferred embodiment is applied.
Figure 2:
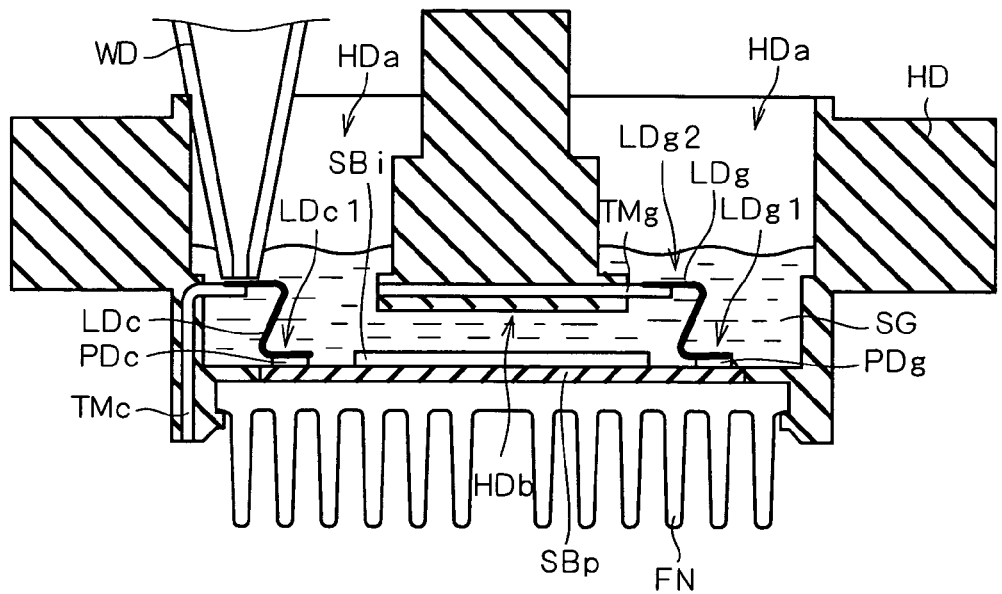
FIG. 2 is a cross section taken along the line II—II of FIG. 1.

FIG. 1 is a plan view showing a structure of a vehicle alternator component CS to which a lead wire bonding method in accordance with the first preferred embodiment is applied. FIG. 2 is a cross section taken along the line II—II of FIG. 1.

As shown in FIGS. 1 and 2, the vehicle alternator component CS includes a brush holder case HD, and the brush holder case HD is provided with surface cavities HDa and a bottom cavity HDb. The surface cavities HDa are provided in two portions in a surface of the brush holder case HD and both the surface cavities HDa are connected to the bottom cavity HDb. Further, in the bottom cavity HDb, brush holder terminals TMa to TMh protruding from the brush holder case HD are exposed. The brush holder terminals TMa to TMh are plate terminals made of, e.g., copper alloy.

A cooling fin FN serving as a heat sink is attached to a bottom of the brush holder case HD, covering the bottom cavity HDb. A printed circuit board SBp is bonded to a surface of the cooling fin FN on a side facing the bottom cavity HDb. On the printed circuit board SBp bonded is an IC (Integrated Circuit) substrate SBi on which a power transistor and the like are formed.

Figure 3:
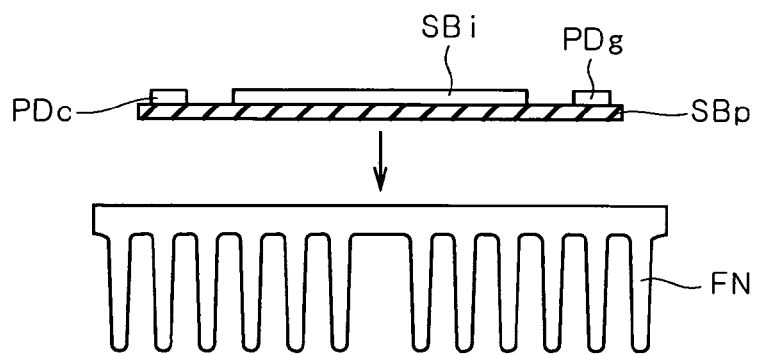
FIGS. 3 to 11 are cross sections showing process steps of the lead wire bonding method in accordance with the first preferred embodiment.

Further, on the printed circuit board SBp soldered are metal pads PDa to PDh which are connected to printed wirings (not shown) formed on a surface of the printed circuit board SBp, respectively. The brush holder terminals TMa to TMh and the corresponding metal pads PDa to PDh are bonded with lead wires LDa to LDh, respectively. The lead wires LDa to LDh are made of, e.g., copper and their surfaces are nickel-plated. After bonding with the lead wires LDa to LDh, the bottom cavity HDb is filled with silicone gel SG FIGS. 3 to 11 are cross sections showing the lead wire bonding method using soldering in accordance with the first preferred embodiment, taking the lead wires LDc and LDg as an example. As shown in FIG. 3, first, the printed circuit board SBp is bonded onto a surface of the cooling fin FN made of aluminum with adhesive. Further, on the printed circuit board SBp, the IC substrates SBi and the metal pads PDa to PDh are soldered in advance.

Figure 4:
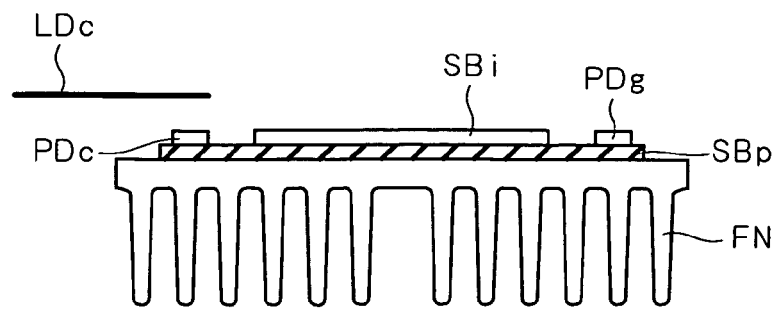
Figure 5:
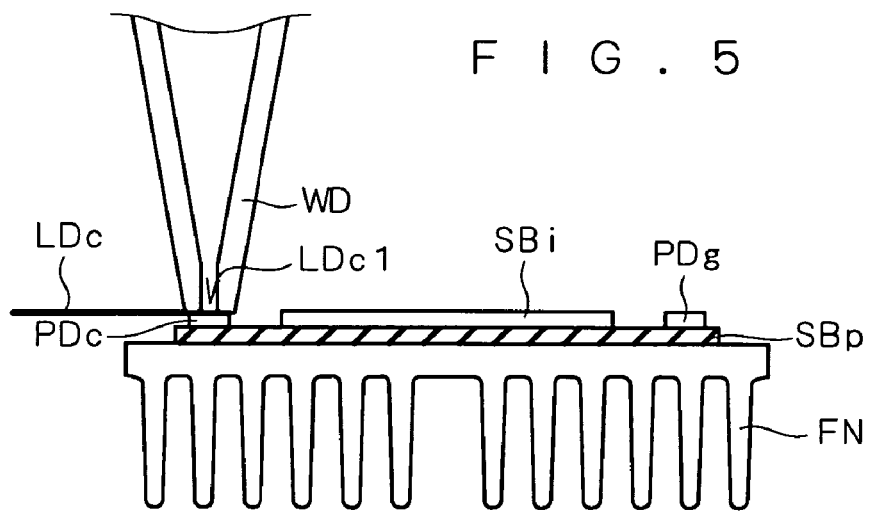

As shown in FIG. 4, next, the plate-like lead wire LDc is so arranged as to extend in parallel to a main surface of the printed circuit board SBp. Then, as shown in FIG. 5, the lead wire LDc is fixed onto the printed circuit board SBp by welding a plate-like surface LDc1 in one end of the lead wire LDc to the metal pad PDc with a laser beam welding jig WD. The tip of the laser beam welding jig WD has a cone shape of hollow and a laser beam is emitted therefrom.

Figure 6:
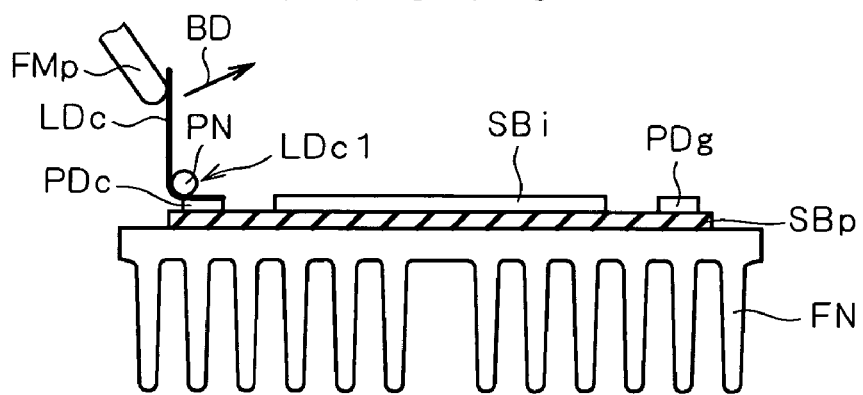

As shown in FIG. 6, next, a portion of the lead wire LDc near its one end is bent by using a jig FMp and a molding pin PN so that the other end of the lead wire LDc should be directed toward a substantially normal direction of the main surface of the printed circuit board SBp. In FIG. 6, the direction of bending is indicated by reference sign BD.

Figure 7:
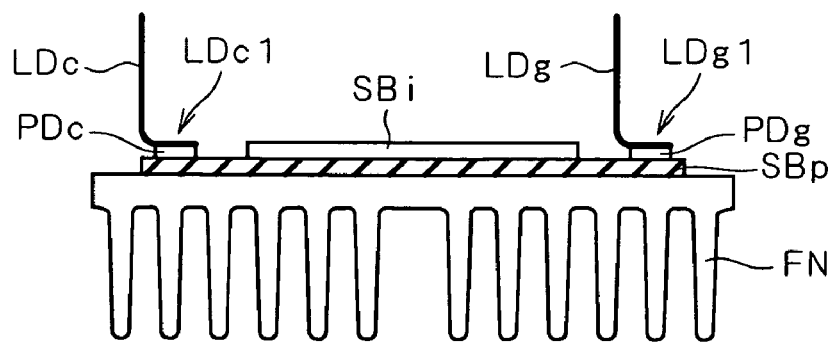

Like the lead wire LDc, fixing of the lead wire LDg to the printed circuit board SBp and formation of a bent portion on the lead wire LDg are performed, as shown in FIG. 7. Further, with respect to the other lead wires LDa, LDb, LDd to LDf and LDh, fixing to the printed circuit board SBp and formation of a bent portion are performed.

Figure 8:
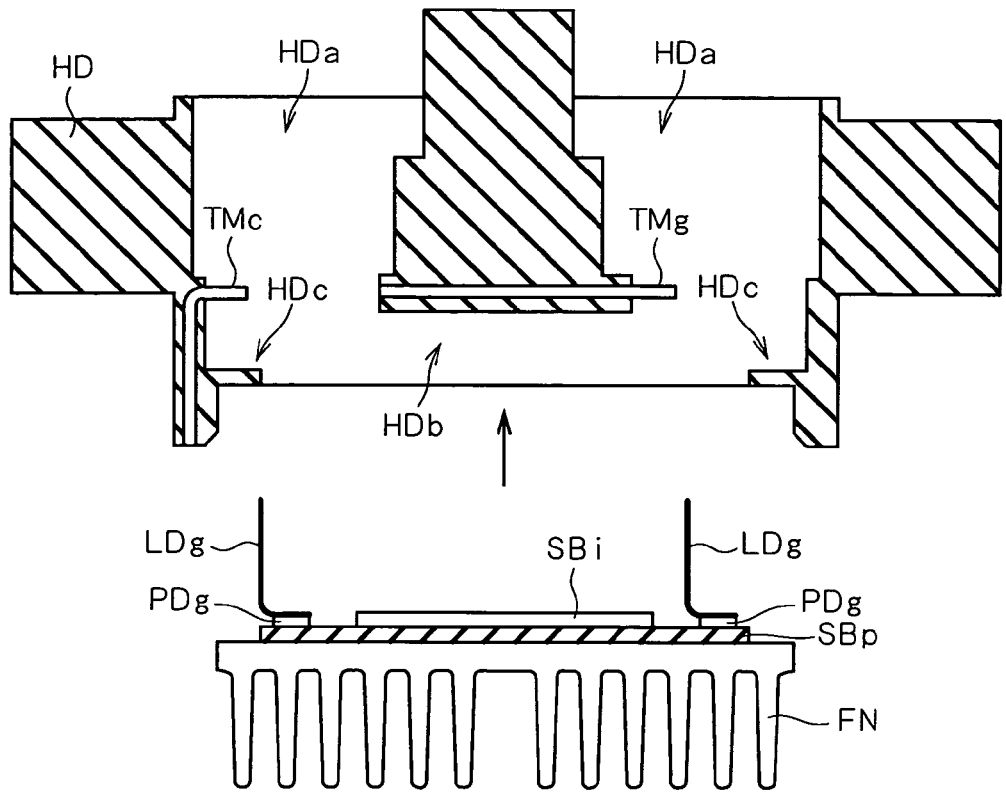
Figure 9:
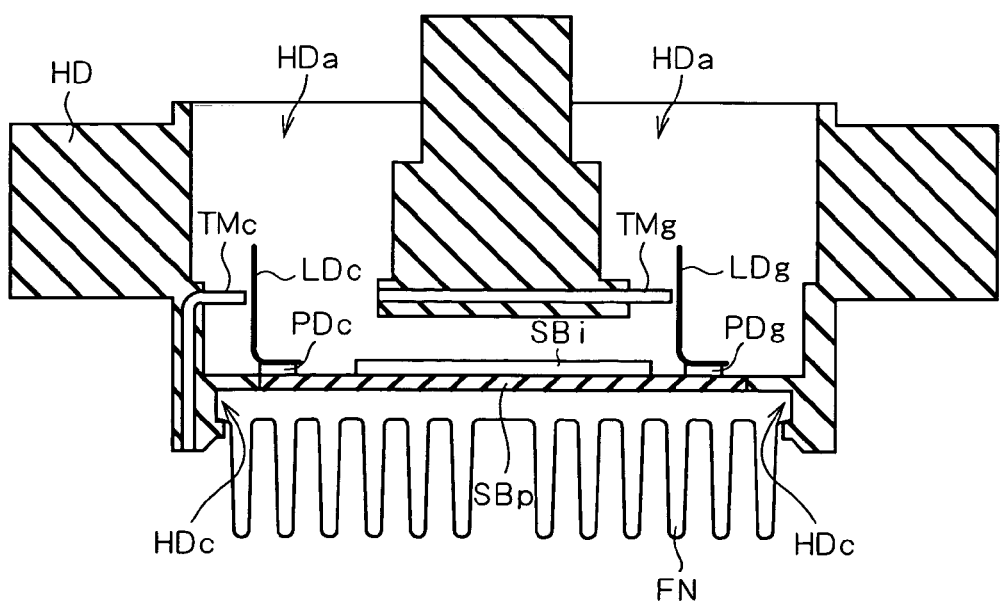

Next, the printed circuit board SBp to which the bent lead wires LDa to LDh are fixed and the cooling fin FN are brought into the bottom cavity HDb of the brush holder case HD in which the brush holder terminals TMa to TMh1 are formed, as shown in FIGS. 8 and 9.

Then, end portions of the cooling fin FN are brought into contact with the contact portion HDc which is provided at the bottom of the brush holder case HD and the periphery of the contact portion HDc is heated. The periphery of the contact portion HDc is so transformed by heating as to sandwich the end portions of the cooling fin FN, for heat clamping.

With this heat clamping, the cooling fin FN is fixed to the brush holder case HD. As a result, the printed circuit board SBp on the cooling fin FN is also fixed to the brush holder case HD with the cooling fin FN interposed therebetween.

Figure 10:
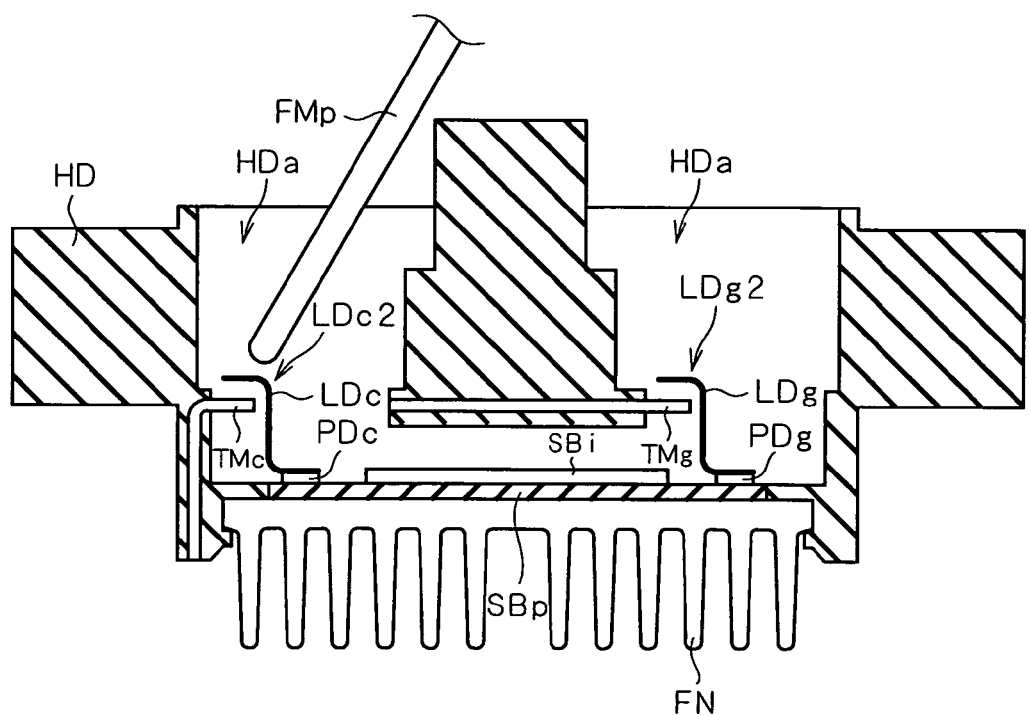
Figure 11:
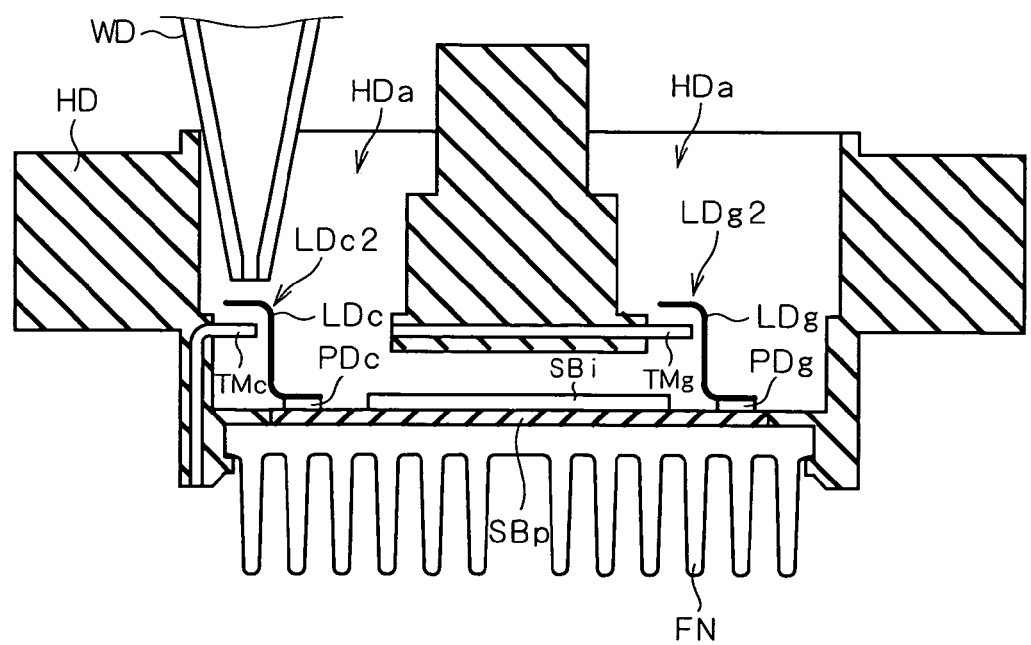

After that, as shown in FIG. 10, respective portions of the lead wires LDa to LDh near their respective other ends are bent by using the jig FMp. Then, as shown in FIG. 11, the lead wires LDa to LDg are bonded to the brush holder terminals TMa to TMh, respectively, by welding plate-like surfaces of respective other ends (indicated by reference signs LDc2 and LDg2 in FIGS. 10 and 11) to the brush holder terminals TMa to TMh with a laser beam welding jig WD. Ultimately, the welded lead wires LDa to LDg each have a Z shape having a plurality of bent portions as shown in FIG. 2. When the lead wires LDa to LDg have the Z shape, even in circumstances with heavy vibration, the bent portions of the lead wires LDa to LDg absorb the vibration to decrease bonding failure of the lead wires LDa to LDg.

In the lead wire bonding method of the first preferred embodiment, the respective one ends of the lead wires LDa to LDg are fixed to the printed circuit board SBp and then the lead wires LDa to LDg are bent. After that, the printed circuit board SBp is brought into the brush holder case HD and the respective other ends of the lead wires LDa to LDg are bonded to the brush holder terminals TMa to TMh of the brush holder case HD, respectively. Therefore, since the lead wires LDa to LD are processed (bent and fixed to the printed circuit board SBp) before the printed circuit board SBp is brought into the brush holder case HD, this eliminates the necessity to perform formation of the bent portion of the lead wires LDa to LDg on the side of the printed circuit board SBp and fixing of the lead wires LDa to LDg to the printed circuit board SBp in a narrow space of the brush holder case HD and allows simplification of bonding operation.

In the lead wire bonding method of the first preferred embodiment, by soldering the metal pads PDa to PDh onto the printed circuit board SBp in advance and then welding the respective one ends of the lead wires LDa to LDh to the metal pads PDa to PDh, respectively, the lead wires LDa to LDh are fixed to the printed circuit board SBp. Therefore, even in a case where it is difficult to weld the lead wires LDa to LDh directly to the surface of the printed circuit board SBp (e.g., where wirings are fused by welding because of very thin printed wiring), it is possible to bond the lead wires LDa to LDh to the printed circuit board SBp.

If the respective one ends of the lead wires LDa to LDh can be soldered to the printed circuit board SBp, naturally, the soldering may be performed without welding the metal pads PDa to PDh.

Further, in the lead wire bonding method of the first preferred embodiment, the plate-like surfaces of the respective one ends of the lead wires LDa to LDh are fixed to the printed circuit board SBp and the portions of the lead wires LDa to LDh near the respective one ends are bent so that the respective other ends of the lead wires LDa to LDh should be directed toward a substantially normal direction of the main surface of the printed circuit board SB. And then, the portions of the lead wires LDa to LDh near the respective other ends are bent and the plate-like surfaces of the respective other ends are bonded to the brush holder terminals TMa to TMh. Therefore, fixing of the lead wires LDa to LDh to the printed circuit board SBp and bonding of the lead wires LDa to LDh to the brush holder terminals TMa to TMh are performed in the wider plate-like surfaces at the one ends and the other ends of the lead wires LDa to LDh. This increases the bonding strength at the one ends and the other ends of the lead wires LDa to LDh and decreases bonding failure.

Furthermore, in the lead wire bonding method of the first preferred embodiment, the printed circuit board SBp which is fixed onto the cooling fin FN serving as a heat sink is brought into the brush holder case HD and the cooling fin FN as a heat sink is fixed to the brush holder case HD. Therefore, in the circumstances with vibration, it becomes hard for the printed circuit board SBp and the brush holder case HD to vibrate separately and this decreases the vibration imposed on the lead wires LDa to LDh. As a result, bonding failure of the lead wires LDa to LDh decreases.

<The Second Preferred Embodiment>

The second preferred embodiment is a variation of the lead wire bonding method of the first preferred embodiment, which uses pin-type lead wires instead of the plate-type lead wires used in the first preferred embodiment. The lead wires are so arranged as to extend toward a substantially normal direction of a main surface of a substrate and the lead wires are so bent as to have respective bent portions between the respective one and other ends of the lead wires with the respective other ends of the lead wires directed toward a substantially normal direction of the main surface of the substrate.

Figure 12:
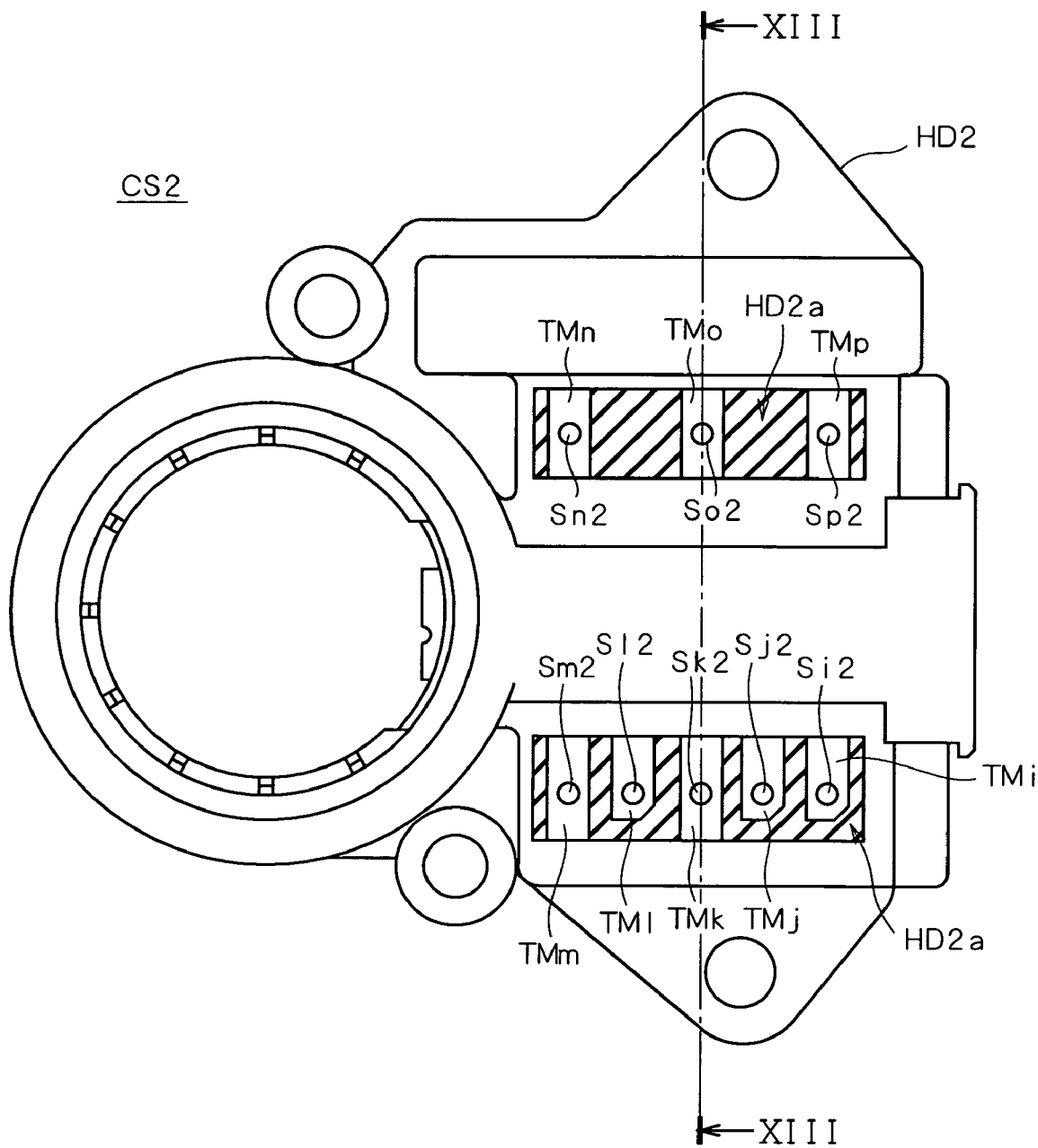
FIG. 12 is a plan view showing a structure of a vehicle alternator component to which a lead wire bonding method using soldering in accordance with a second preferred embodiment is applied.
Figure 13:
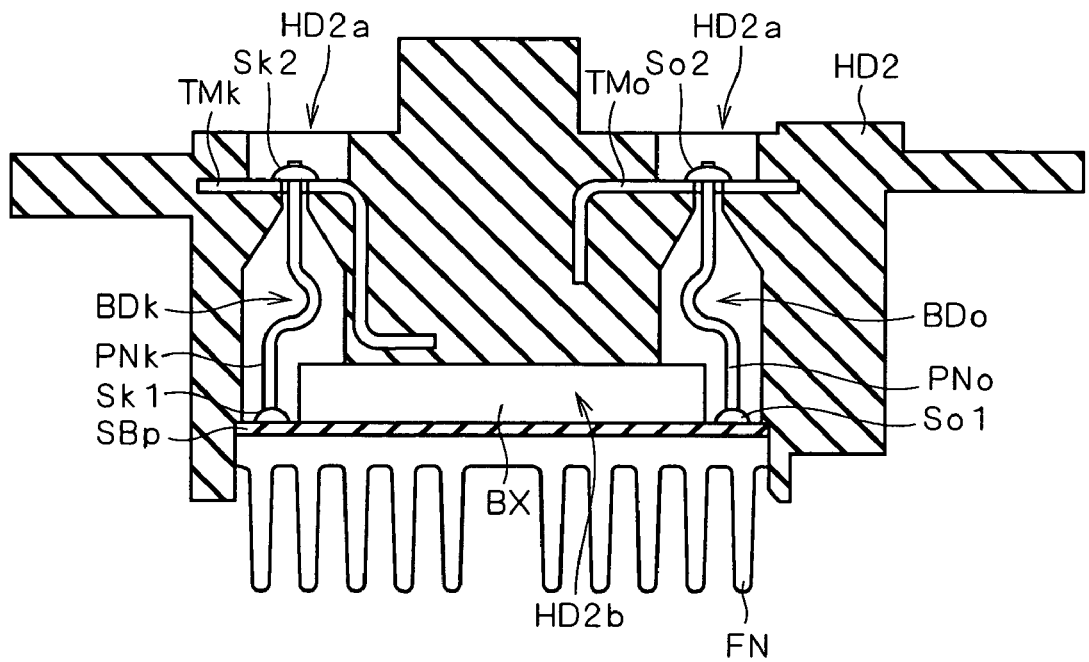
FIG. 13 is a cross section taken along the line XIII—XIII of FIG. 12.

FIG. 12 is a plan view showing a structure of a vehicle alternator component CS2 to which a lead wire bonding method using soldering in accordance with the second preferred embodiment is applied. FIG. 13 is a cross section taken along the line XIII—XIII of FIG. 12.

As shown in FIGS. 12 and 13, the vehicle alternator component CS2 includes a brush holder case HD2, and the brush holder case HD2 is provided with surface cavities HD2a and a bottom cavity HD2b. The surface cavities HD2a are provided in two portions in a surface of the brush holder case HD2 and both the surface cavities HD2a are provided with a plurality of holes leading to the bottom cavity HDb. Further, in the surface cavities HD2a, brush holder terminals TMi to TMp are so provided as to cover the holes. The brush holder terminals TMi to TMp are plate terminals made of, e.g., iron and provided with such pin holes as to correspond to the holes of the surface cavities HD2a.

The cooling fin FN is attached to a bottom of the brush holder case HD2, covering the bottom cavity HD2b. The printed circuit board SBp is bonded to a surface of the cooling fin FN on a side facing the bottom cavity HD2b. On the printed circuit board SBp bonded is a cover BX encapsulating the IC substrate on which a power transistor and the like are formed.

Further, on the printed circuit board SBp, pin-type lead wires PNi to PNp (FIG. 13 shows only pin-type lead wires PNk and PNo and other pin-type lead wires have the same structure) to be bonded to the brush holder terminals TMi to TMp are soldered with solders Si1 to Sp1 (FIG. 13 shows only the solders Sk1 and So1), respectively. Then, the pin-type lead wires PNi to PNp penetrate the respective pin holes of the brush holder terminals TMi to TMp and are soldered to the brush holder terminals TMi to TMp with solders Si2 to Sp2, respectively. The pin-type lead wires PNi to PNp are also made of, e.g., copper and their surfaces are nickel-plated.

Figure 14:
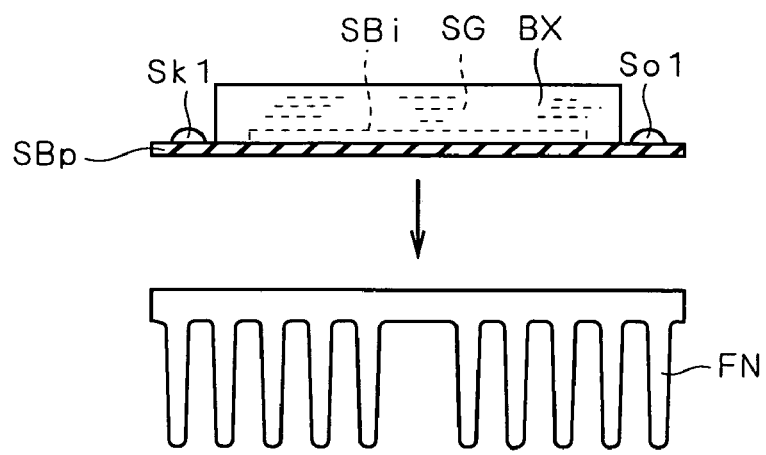

FIGS. 14 to 19 are cross sections showing the lead wire bonding method using soldering in accordance with the second preferred embodiment, taking the pin-type lead wires PNk and PNo as an example. As shown in FIG. 14, first, the printed circuit board SBp is bonded onto the surface of the cooling fin FN made of aluminum with adhesive. Further, on the printed circuit board SBp, the IC substrate SBi is bonded and the cover BX is also bonded, being filled with silicone gel SG Further, the solders Si1 to Sp1 are applied onto the printed circuit board SBp in advance.

As shown in FIGS. 15 and 16, next, the pin-type lead wires PNk and PNo are so arranged as to extend toward a substantially normal direction of the main surface of the printed circuit board SBp and respective one ends BTk and BTo are fixed onto the printed circuit board SBp with solders Skl and Sol by using a soldering iron SD.

Figure 17:
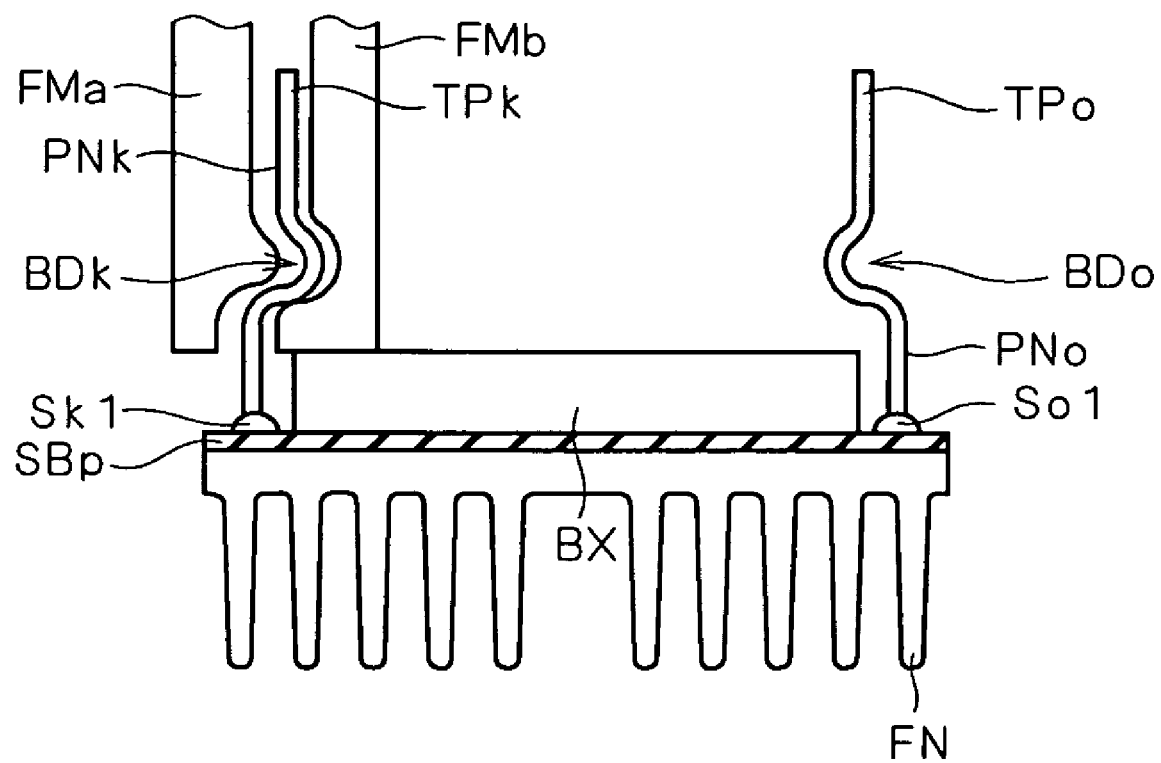

As shown in FIG. 17, next, the pin-type lead wires PNk and PNo are so bent by using molds FMa and FMb as to have C-shaped bent portions BDk and BDo between the respective one and other ends of the pin-type lead wires PNk and PNo with the respective other ends TPk and TPo of the pin-type lead wires PNk and PNo directed toward a substantially normal direction of the main surface of the printed circuit board SBp. Similarly, also with respect to the other pin-type lead wires PNi, PNj, PNl to PNn and PNp, fixing to the printed circuit board SBp and formation of bent portions are performed.

The shape of the bent portions of the pin-type lead wires PNi to PNp is not limited to a C shape but may be, e.g., an S shape or the like. If the pin-type lead wires PNi to PNp have such bent portions, even in circumstances with heavy vibration, the bent portions of the pin-type lead wires PNi to PNp absorb the vibration to decrease bonding failure of the pin-type lead wires PNi to PNp.

Figure 18:
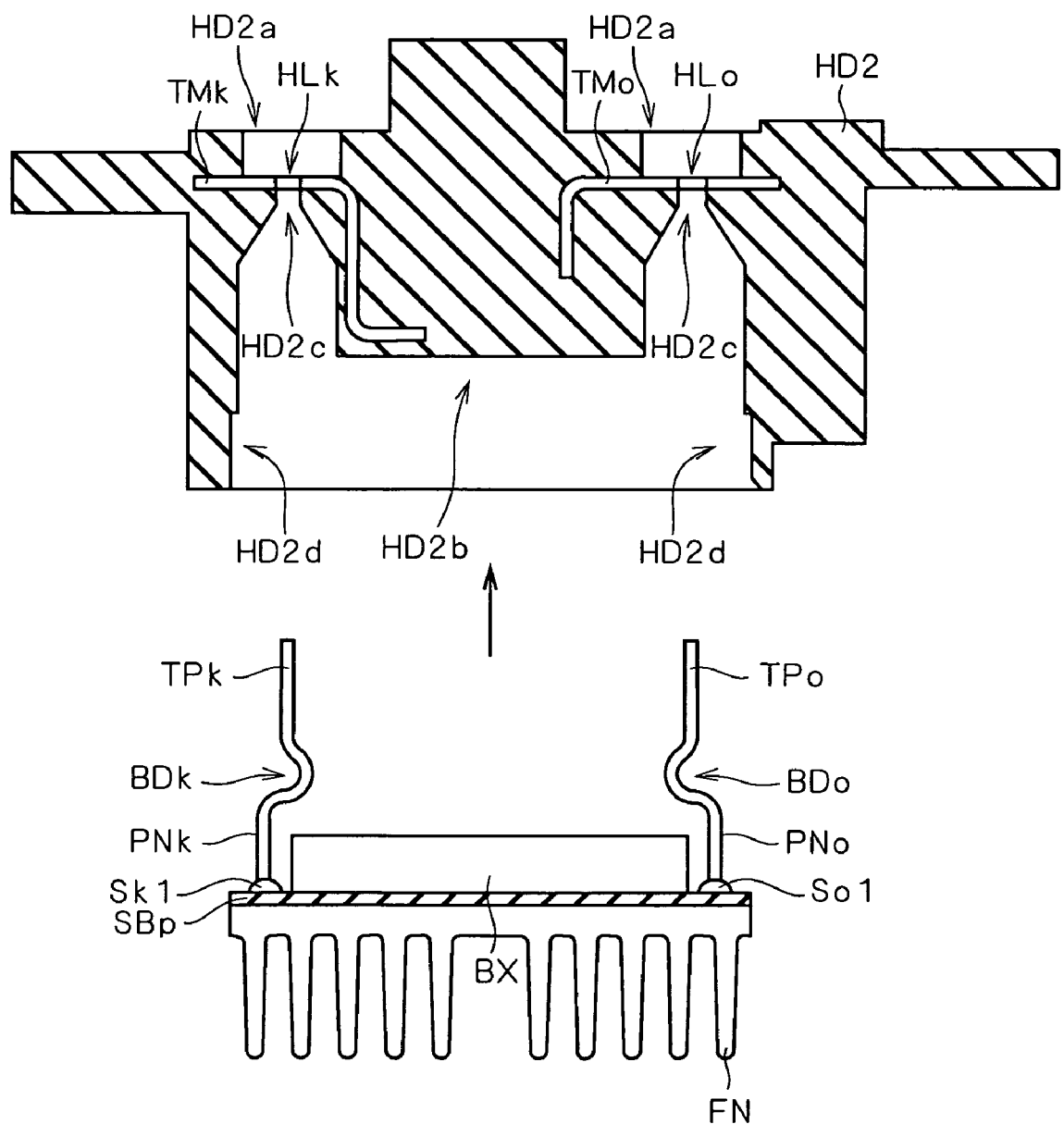

Next, the printed circuit board SBp to which the bent pin-type lead wires PNi to PNp are fixed and the cooling fin FN are brought into the bottom cavity HD2b of the brush holder case HD2 in which the brush holder terminals TMi to TMp are formed, as shown in FIG. 18. At this time, the other ends TPi to TPp (FIG. 18 shows only the other ends TPk and TPo) of the pin-type lead wires PNi to PNp go through a pin introducing portion HD2c in the brush holder case HD2 and penetrate the holes of the surface cavities HD2a and the pin holes HLi to HLp (FIG. 18 shows only the pin holes HLk and HLo) of the brush holder terminals TMi to TMp, respectively.

Then, the end portions of the cooling fin FN are brought into contact with the contact portion HD2d which is provided at the bottom of the brush holder case HD2 and the periphery of the contact portion HD2d is heated. The periphery of the contact portion HD2d is transformed by heating to sandwich the end portions of the cooling fin FN, for heat clamping.

With this heat clamping, the cooling fin FN is fixed to the brush holder case HD2. As a result, the printed circuit board SBp on the cooling fin FN is also fixed to the brush holder case HD2 with the cooling fin FN interposed therebetween.

Figure 19:
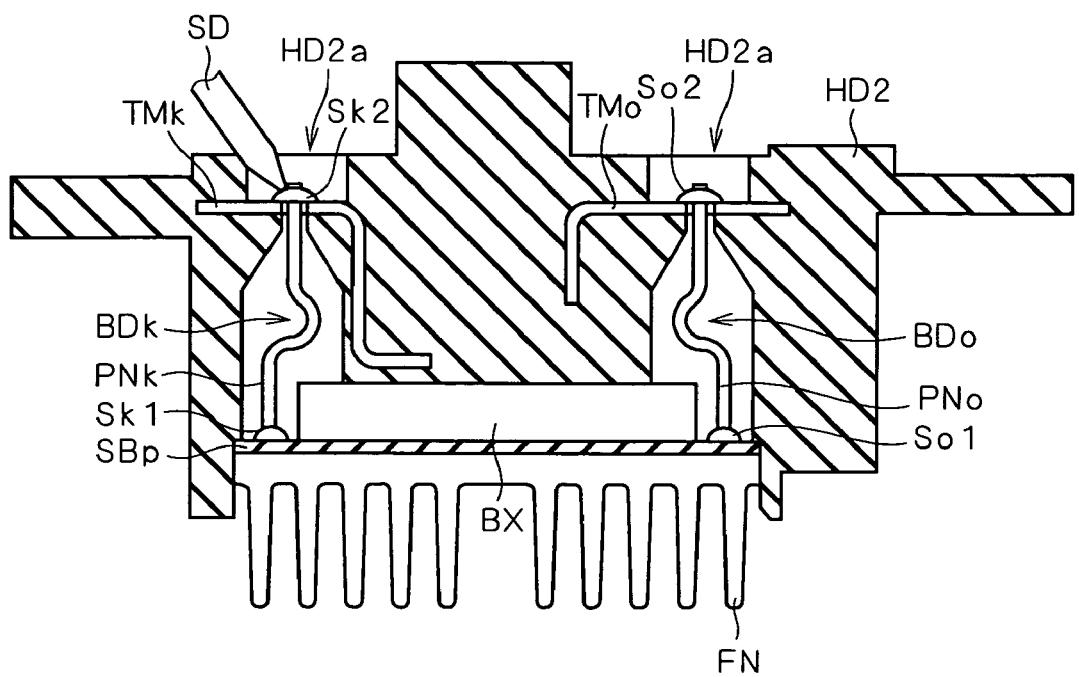

After that, as shown in FIG. 19, the respective other ends TPi to TPp of the pin-type lead wires PNi to PNp are fixed to the brush holder terminals TMi to TMp, respectively, with solders Si2 to Sp2 by using the soldering iron SD.

In the lead wire bonding method of the second preferred embodiment, the pin-type lead wires PNi to PNo are so bent as to have the bent portions between the respective one and other ends of the pin-type lead wires PNi to PNo with the respective other ends TPi to TPo of the pin-type lead wires PNi to PNo directed toward a substantially normal direction of the main surface of the printed circuit board SBp. Therefore, since the bent portions which absorb vibration even in circumstances with heavy vibration can be formed away from both the respective one and other ends of the pin-type lead wires PNi to PNp by providing the bent portions at a substantially center portion between the respective one and other ends of the pin-type lead wires PNi to PNp, bonding failure at the one and other ends of the pin-type lead wires PNi to PNp decreases.

While the invention has been shown and described in detail, the foregoing description is in all aspects illustrative and not restrictive. It is therefore understood that numerous modifications and variations can be devised without departing from the scope of the invention.

What is claimed is:

1. A lead wire bonding method comprising:
   (a) fixing one end of a lead wire having said one end and an other end to a substrate;
   (b) bending said lead wire after being fixed; and
   (c) bringing said substrate, to which said bent lead wire is fixed, into a case having a terminal and bonding said other end of said lead wire to said terminal of said case, wherein:
   said lead wire has a plate-like shape;
   said lead wire is so arranged as to extend in parallel to a main surface of said substrate and a plate-like surface of said one end of said lead wire is fixed to said substrate in said step (a);
   a portion of said lead wire near said one end is bent so that said other end of said lead wire is directed toward a substantially normal direction of said main surface of said substrate in said step (b); and
   a plate-like surface of said other end is bonded to said terminal with a portion of said lead wire near said other end also bent in said step (c).

2. The lead wire bonding method according to claim 1, wherein:
   a metal pad is soldered onto said substrate in advance; and said lead wire is fixed to said substrate by welding said one end of said lead wire to said metal pad in said step (a).

3. A lead wire bonding method comprising:
(a) fixing one end of a lead wire having said one end and an other end to a substrate;
(b) bending said lead wire after being fixed; and
(c) bringing said substrate, to which said bent lead wire is fixed, into a case having a terminal and bonding said other end of said lead wire to said terminal of said case, wherein:

said lead wire has a pin-like shape;

said lead wire is so arranged as to extend in a substantially normal direction of a main surface of said substrate and said one end of said lead wire is fixed to said substrate in said step (a); and said lead wire is so bent as to have a bent portion between said one end and said other end of said lead wire with said other end of said lead wire directed toward a substantially normal direction of said main surface of said substrate in said step (b).

4. The lead wire bonding method according to claim 3, wherein said step (c) comprises:

(c1) bringing said substrate which is fixed onto a heat sink into said case;

(c2) fixing said heat sink to said case; and (c3) bonding said other end of said lead wire to said terminal of said case.

* * * * *